United States Patent
De Steur et al.

(10) Patent No.: US 6,783,688 B2
(45) Date of Patent: Aug. 31, 2004

(54) METHOD AND APPARATUS FOR STRUCTURING PRINTED CIRCUIT BOARDS

(75) Inventors: Hubert De Steur, Drongen (BE); Marcel Heerman, Merelbeke (BE); Eddy Roelants, Bruegge (BE)

(73) Assignee: Siemens Aktiengesellschaft, Munich (DE)

( * ) Notice: Subject to any disclaimer, the term of this patent is extended or adjusted under 35 U.S.C. 154(b) by 159 days.

(21) Appl. No.: 10/079,896

(22) Filed: Feb. 22, 2002

(65) Prior Publication Data

US 2003/0000916 A1 Jan. 2, 2003

(30) Foreign Application Priority Data

Jun. 6, 2001 (DE) .......................................... 101 27 357

(51) Int. Cl.⁷ .................................................. H05K 3/02
(52) U.S. Cl. ............................ 216/13; 216/17; 216/41; 216/51; 219/121.69
(58) Field of Search ............................ 216/13, 17, 41, 216/51; 219/121.69

(56) References Cited

U.S. PATENT DOCUMENTS

| | | | | |
|---|---|---|---|---|
| 5,364,493 A | * | 11/1994 | Hunter et al. ................ | 216/66 |
| 5,397,433 A | * | 3/1995 | Gabriel ........................ | 438/713 |
| 5,895,581 A | * | 4/1999 | Grunwald .................... | 216/13 |
| 5,989,989 A | * | 11/1999 | Terrill .......................... | 438/598 |
| 6,576,402 B2 | * | 6/2003 | Heerman et al. ........... | 430/313 |
| 6,627,091 B1 | * | 9/2003 | Van Puymbroeck ........ | 216/13 |

FOREIGN PATENT DOCUMENTS

| | | | | |
|---|---|---|---|---|
| DE | 4131065 A1 | 3/1993 | | |
| DE | 4429522 A1 | 3/1995 | | |
| DE | 19719700 A1 | 11/1998 | | |
| EP | 0062300 A2 | 10/1982 | | |
| GB | 2286787 A | 8/1995 | | |
| JP | 60119790 A | * | 6/1985 | ............ H05K/3/02 |
| JP | 04168702 A | * | 6/1992 | ........... H01C/17/24 |
| WO | WO 00/04750 A1 | 1/2000 | | |
| WO | WO 01/38036 A1 | 5/2001 | | |

* cited by examiner

*Primary Examiner*—Anita Alanko
(74) *Attorney, Agent, or Firm*—Harness, Dickey & Pierce, P.L.C.

(57) ABSTRACT

A method and device can be used to pattern both regions of a printed circuit board which are provided for coarse conductor structures and regions which are provided for relatively fine conductor structures of the printed circuit board. In each case, this can be done via laser processing. Both regions are firstly coated with a continuous metallization layer and covered with an etch resistor. The coarse conductor structures are predefined with a laser beam with a relatively long wavelength by exposing the metal surfaces which are not required. In addition, the fine conductor structures are also pre-shaped by processing the etch resist with a laser beam with a relatively short wavelength. Then, in a common etching process, all the exposed surface regions of the metal layer are etched away so that only the coarse and fine conductor track structures which are covered by the remaining etch resist are left. As a result of the removal of the rest of the etch resist, the surfaces of the conductor tracks which are produced are then exposed.

8 Claims, 4 Drawing Sheets

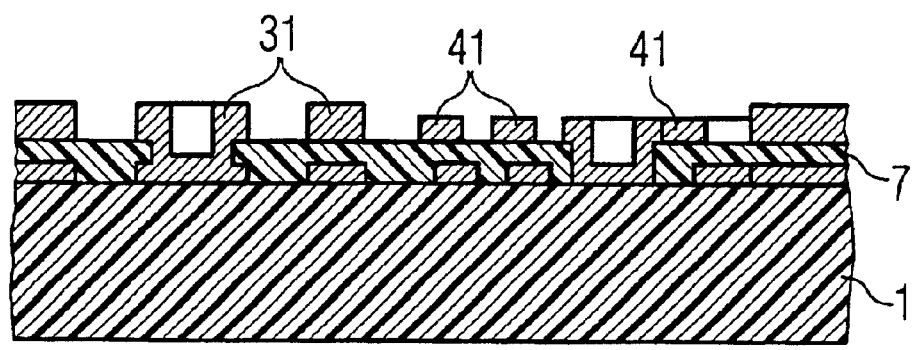
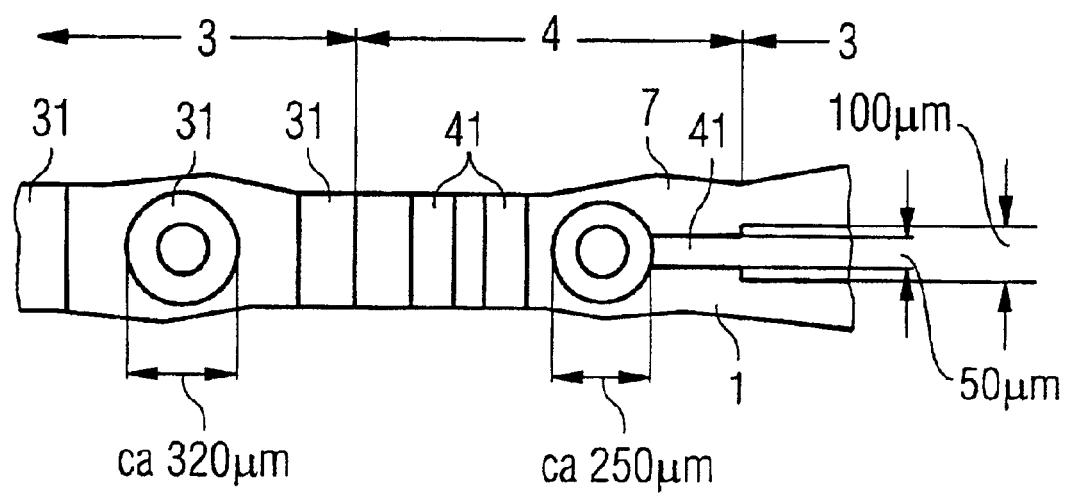

METHOD AND APPARATUS FOR STRUCTURING PRINTED CIRCUIT BOARDS

The present application hereby claims priority under 35 U.S.C. §119 on German patent publication number DE 10127357.6 filed Jun. 6, 2001, the entire contents of which are hereby incorporated by reference.

FIELD OF THE INVENTION

The invention generally relates to a method and a device for patterning printed circuit boards. Preferably, the circuit boards are ones with coarse conductor structures and with at least one region with fine conductor structures. A metal layer may be applied to an electrically insulating substrate and the desired conductor structure may be exposed from this metal layer by partial etching.

BACKGROUND OF THE INVENTION

EP 0 062 300 A2 has already disclosed a method for manufacturing printed circuit boards in which a metallic etch resist is applied over all the surface of a metal layer, and is selectively removed again in the areas which do not correspond to the conductor structures using laser irradiation. The conductor structures are then formed by etching away the metal layer which is exposed in this way.

DE 41 31 065 A1 also discloses a method for manufacturing printed circuit boards in which a metal layer and a metallic or organic etch resist layer are applied in succession to a substrate, after which this etch resist layer is removed using laser irradiation in the regions which directly adjoin the later conductor track pattern. The metal layer which is exposed as a result, is etched away in such a way that the conductor track pattern, and islands of the metal layer on the substrate, which are electrically insulated from the pattern by etched trenches, remain. The patterning using laser irradiation can be performed quickly because the regions of the etch resist layer to be removed only have to have a small width and the relatively large surfaces between two conductor tracks are left.

WO 00/04750 A1 also describes a method for manufacturing coarse conductor structures and fine conductor structures in which an etch resist is patterned in the region of the coarse conductor structures via photolithography, while an etch resist is patterned in the region of the fine conductor structures using a laser beam. The etch resist layers which are thus patterned in various ways are then etched in a known fashion. Although the possibility of operating with the same etch resist for the various patterning methods and of etching both the coarse and the fine conductor structures in one operation are mentioned in the publication, an optimum operating sequence is not obtained here because the metallic etch resist (for example tin) which is generally used for the laser patterning is less suitable for the photolithographic method.

SUMMARY OF THE INVENTION

The object of an embodiment of the present invention is to specify a method and a device with which printed circuit boards with coarse and fine conductor structures can be patterned in as simple and economical way as possible. According to an embodiment of the invention, this object can be achieved with the following method steps:

a) applying a metal layer to an electrically insulating substrate, b) applying an etch resist layer to the metal layer, c) exposing the contours (62) of the envisaged coarse conductor structures (31) by partially eroding the etch resist layer (61) with a first laser beam (14) with a predefined first wavelength and a first processing field size (3) which is predefined by a first imaging unit (13), d) exposing the contours (63) of the fine conductor structures by partially eroding the etch resist layer (61) with a second laser beam (24) with a predefined second wavelength and a second processing field size (4) which is predefined by a second imaging unit (23), the second wavelength being shorter than the first wavelength and/or the second field size (4) being smaller than the first field size (3), e) producing the coarse and the fine conductor structures (31, 41) simultaneously by etching the exposed metal regions (62, 63), and f) exposing the surfaces of the conductor structures by eroding the rest of the etch resist layer.

An embodiment of the invention is therefore concerned with producing both coarse and fine conductor structures with similar method steps, specifically by patterning an etch resist layer and subsequently etching, but allowing for different conductor structures and correspondingly different insulating spacings by the selection of different lasers. In doing so, a better processing speed for the respective structure is achieved. In this regard, an embodiment of the invention makes use of the realization that a laser beam with a short wavelength and a short focal length can produce fine structures with precision in a small processing field, but is too slow for an economic method of operation for processing relatively wide structures and relatively large fields, while a laser beam with a long wavelength and a setting to a large focal length can process relatively wide structures in a large processing field at a considerably higher speed.

In one advantageous embodiment of the method according to the invention, there is provision that, for the processing of the coarse conductor structures, the first laser has a wavelength between 1064 nm and 355 nm, preferably 1064 nm, and the second laser has a wavelength between 532 and 266 nm, preferably 532 or 355 nm, the wavelength of the first laser being in all cases greater than that of the second laser. Furthermore, in the preferred refinement of the method according to an embodiment of the invention there is provision for the beam of the first laser to be focussed over a larger focal length than the beam of the second laser. As a result of this, the first laser passes over a larger processing area than the second laser.

A device according to an embodiment of the invention for patterning printed circuit boards with coarse conductor structures and with at least one region with fine conductor structures has the following features:

a) a support for positioning a printed circuit board, b) a first laser with a deflection optical device and an imaging unit with a first focal length which can be positioned over the surface of the printed circuit board in such a way that it is capable of irradiating a first processing field size, c) a second laser with a deflection optical device and an imaging unit with a second focal length which is capable of irradiating a second processing field size, the second laser having a longer wavelength than the first laser, and/or the second focal length and the second field size being smaller than the first focal length and the first field size, and d) a control device for respectively irradiating large fields of the printed circuit board with coarse conductor structures using the first laser and relatively small fields of the printed circuit board with relatively fine conductor structures using the second laser.

BRIEF DESCRIPTION OF THE DRAWINGS

The invention is explained in more detail below by means of exemplary embodiments and with reference to the drawings, in which:

FIGS. 3 to 6 show a detail from a printed circuit board—in a sectional view—in the individual method stages during the manufacture according to an embodiment of the invention of the coarse and fine conductor structures, FIG. 7 shows a plan view of the conductor track structure according to FIG. 6.

DETAILED DESCRIPTION OF THE PREFERRED EMBODIMENTS

Figure 1:
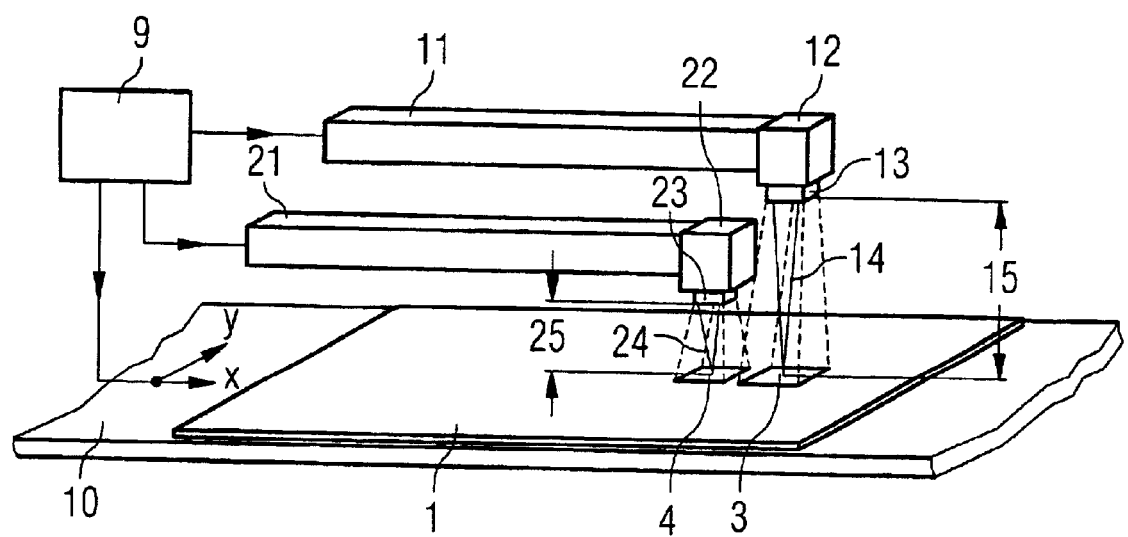
FIG. 1 shows the schematic arrangement of two lasers for the method according to an embodiment of the invention.

FIG. 1 is a schematic view of an arrangement which is suitable for carrying out the method according to an embodiment of the invention. Two lasers, namely a first laser 11 and a second laser 21 are arranged over a printed circuit board 1, which lies in a processing area on a table 10 which can be displaced in its plane in the x and y directions. The first laser 11 produces, via a deflection optical device 12 and a lens arrangement 13, a first laser beam 14 which is focussed on the surface of the printed circuit board 1 and can pass over a first, relatively large processing field 3 by virtue of a relatively large first focal length. The second laser 21 produces, using its deflection optical device 22 and the lens arrangement 23, a second laser beam 24 which is capable of passing over a smaller processing field 4 owing to the short focal length 25. Both lasers 11 and 21 have a different wavelength. For example, the laser 11 is a neodymium YAG laser with a wavelength of 1024 nm, while the laser 21 can be a neodymium-vanadate laser with a wavelength of 532 or 355 nm. Both the two lasers 11 and 21 and the table are controlled by a central control unit 9.

Figure 2:
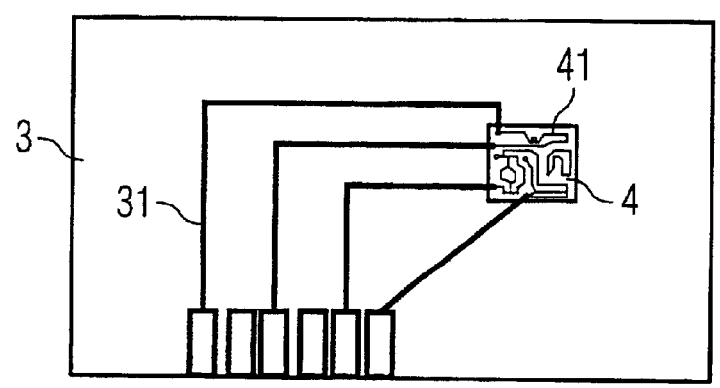
FIG. 2 shows a plan view of a schematically illustrated printed circuit board with coarse and fine conductor structures.
Figure 3:
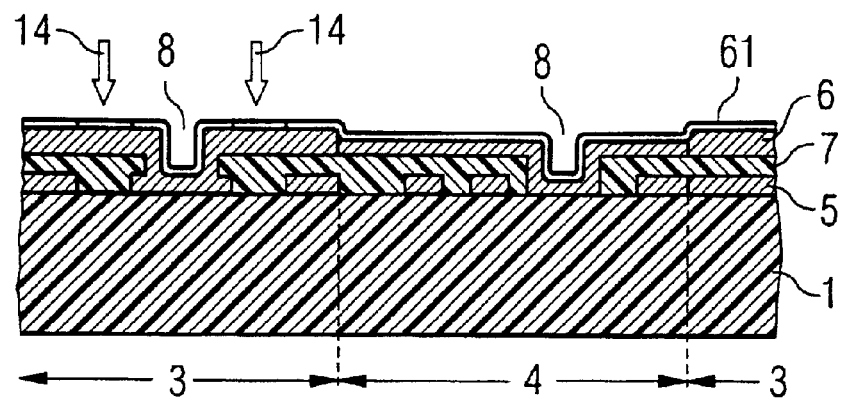
Figure 4:
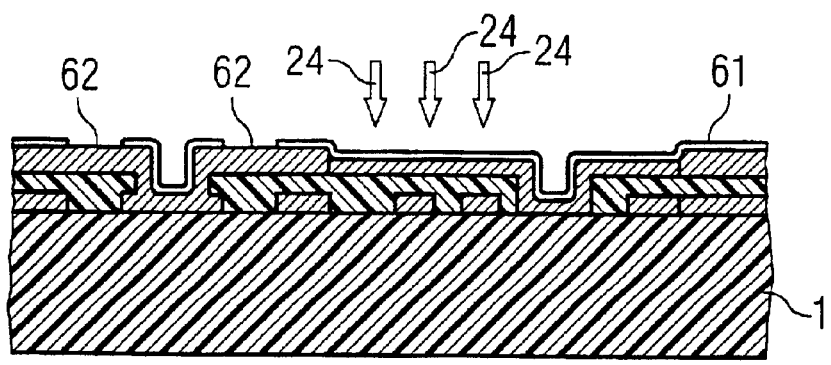
Figure 5:
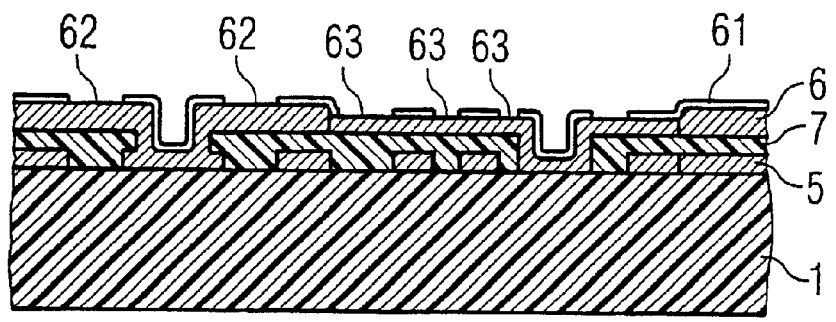

FIG. 2 is a schematic view of a large processing field 3 with coarse conductor track structures 31 and a small processing field 4, which is arranged within the processing field 3 and has fine conductor structures 41. Both the coarse structures 31 and the fine structures 41 are acquired using the two lasers 11 and 21 in accordance with the method according to an embodiment of the invention.

The individual method steps can be followed with reference to FIGS. 3 to 6. These figures show a section through a portion of a printed circuit board 1 which has, for example, two conductive layers 5 and 6 which lie one on top of the other and are separated from one another by a dielectric layer 7. As is apparent in FIG. 3, the inner layer 5 is already patterned and the outer conductive layer 6 is partially connected to the inner conductive layer 5 via drilled holes or cut-outs 8 in the dielectric layer 7. In order to pattern the conductive layer 6, an etch resist layer 61, which is composed, for example, of tin, is then applied both in the region of the processing field 3 and in the region of the processing field 4. In the region of the desired coarse conductor track structure 3, laser beams 14 from the first laser 11 are used to erode the etch resist layer 61 in locations where the intention is that there will be no conductive surfaces or conductor tracks, i.e. where insulation spacings are desired. The regions 62 are thus exposed, as is apparent in FIG. 4. Insulation regions of the second processing field 4 which are selected with the laser beams 24 of the second laser 2 are then partially irradiated in such a way that the regions of the metal layer 6 which are not desired for the fine conductor structures are exposed. The cut-outs 63 which are produced in this way result in a structure according to FIG. 5.

The entire printed circuit board is then etched, as a result of which the regions of the metal layer 6 which are exposed underneath the regions 62 and 63 are etched away so that a structure according to FIG. 6 with coarse conductor structures 31 and fine conductor structures 41 is produced.

The plan view according to FIG. 7 shows how the size ratios of the coarse conductor structures and the fine conductor structures differ. The coarse conductor structures have conductor track widths in the order of magnitude of 100 μm, while the fine conductor track structures have conductor track widths, and corresponding spacings, in the order of magnitude of 50 μm. The boundary between the two regions is at approximately 75 μm.

Figure 8:
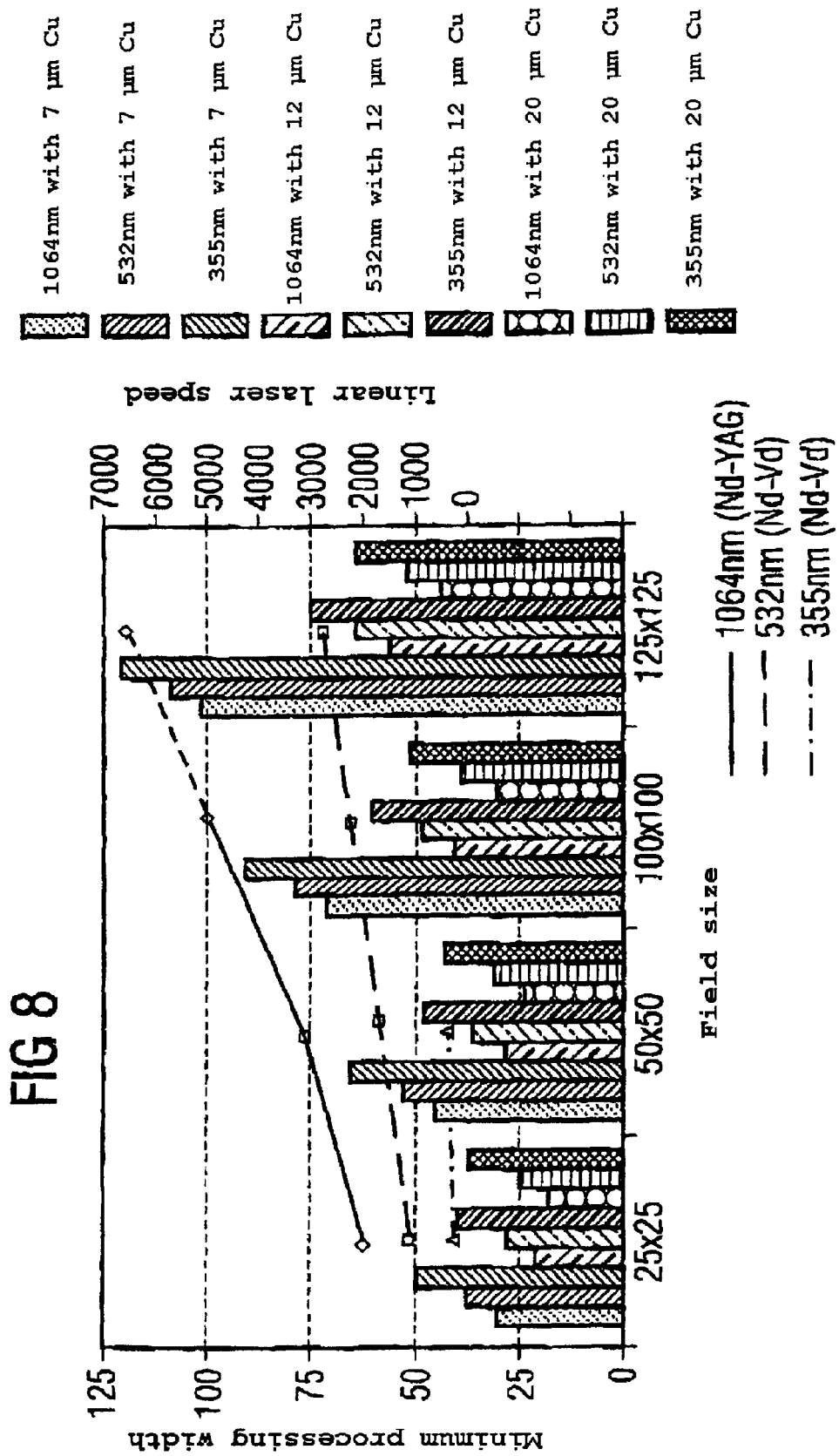
FIG. 8 shows a diagram illustrating the insulation trenches which can be obtained with different lasers as a function of different layer thicknesses and different field sizes and which are allocated between the conductor structures, together with the processing speeds which can be achieved.

The respective laser for the coarse structuring and for the fine structuring can be selected by reference to the diagram in FIG. 8. It shows which minimum spaces are produced between the conductor tracks by the processing with the respective laser, and the subsequent etching, this trench width also depending on the thickness of the copper layer owing to the unavoidable back etching. The way in which the setting of the focal length, on which the field size of the processing field depends, affects the trench width is additionally specified for each type of laser. For example, with an infrared laser with a wavelength of 1064 nm at a copper layer of 7 μm, the subsequent etching produces a trench width of approximately 28 μm, while for the same laser at a copper layer of 20 μm a trench width of 50 μm is obtained, assuming in all cases that the focal length of the laser is set to a field size of 25×25 mm². If the same laser is set to a field of 150×150 mm², the etched trenches between the conductor tracks are already at least 100 to 120 μm wide, depending on the thickness of the copper layer. However, with this latter setting a significantly higher processing speed is obtained, as is apparent from the continuous line with the speed scale on the right-hand side of the diagram. With the lasers of shorter wavelengths, 532 nm and 355 nm, respectively, correspondingly smaller trench widths are obtained for desired fine structures, but the processing speed is also lower, as is apparent from the dashed and dot-dashed lines.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for patterning printed circuit boards having coarse conductor structures and having at least one region with fine conductor structures, comprising:

applying a metal layer to an electrically insulating substrate;

applying an etch resist layer to the metal layer;

exposing contours of envisaged coarse conductor structures, by partially eroding the etch resist layer with a first laser beam with a predefined first wavelength and a first processing field size;

exposing contours of the fine conductor structures, by partially eroding the etch resist layer with a second laser beam with a predefined second wavelength and a second processing field size, at least one of the second wavelength being relatively shorter than the first wavelength and the second field size being relatively smaller than the first field size;

producing the coarse and the fine conductor structures simultaneously by etching the exposed metal regions; and exposing the surfaces of the conductor structures by eroding the remainder of the etch resist layer.

2. The method as claimed in claim 1, wherein the laser beam of the first laser has a wavelength between 1064 nm and 355 nm, and the laser beam of the second laser has a wavelength between 532 nm and 266 nm.

3. The method as claimed in claim 2, wherein the first laser beam has a wavelength of 1064 nm, and the second laser beam has a wavelength of at least one of 532 and 355 nm.

4. The method as claimed in claim 1, wherein the first laser includes an optical imaging unit which produces a larger focal length than an optical imaging unit of the second laser.

5. The method of claim 1, wherein the first processing field size is predefined by a first imaging unit.

6. The method of claim 5, wherein the second processing field size is predefined by a second imaging unit.

7. The method of claim 1, wherein the second processing field size is predefined by a second imaging unit.

8. The method of claim 2, wherein the wavelength of the second laser beam is at most equal to that of the first laser beam.

* * * * *